United States Patent
Borland et al.

(10) Patent No.: US 7,572,518 B2
(45) Date of Patent: Aug. 11, 2009

(54) ARTICLES COMPRISING MANGANESE DOPED BARIUM TITANATE THIN FILM COMPOSITIONS

(75) Inventors: William Borland, Chapel Hill, NC (US); Ian Burn, Hockessin, DE (US); Jon Fredrick Ihlefeld, State College, PA (US); Jon Paul Maria, Raleigh, NC (US); Seigi Suh, Cary, NC (US)

(73) Assignees: E. I. du Pont de Nemours and Company, Wilmington, DE (US); North Carolina State University, Raleigh, NC (US)

( * ) Notice: Subject to any disclaimer, the term of this patent is extended or adjusted under 35 U.S.C. 154(b) by 0 days.

(21) Appl. No.: 11/923,594

(22) Filed: Oct. 24, 2007

(65) Prior Publication Data
US 2008/0044672 A1 Feb. 21, 2008

Related U.S. Application Data

(62) Division of application No. 11/157,621, filed on Jun. 21, 2005, now abandoned.

(51) Int. Cl.
*B32B 9/00* (2006.01)
(52) U.S. Cl. .................. 428/469; 428/472; 428/702
(58) Field of Classification Search .............. None
See application file for complete search history.

(56) References Cited

U.S. PATENT DOCUMENTS

| | | | |
|---|---|---|---|
| 3,920,781 A | 11/1975 | Eror et al. | |
| 4,855,266 A | 8/1989 | Burn | |
| 4,988,468 A | 1/1991 | Nishioka et al. | |
| 5,155,072 A | 10/1992 | Bruno et al. | |
| 5,198,269 A | 3/1993 | Swartz et al. | |
| 5,271,955 A | 12/1993 | Maniar | |
| 5,296,646 A | 3/1994 | Capper et al. | |
| 5,342,648 A | 8/1994 | MacKenzie et al. | |
| 5,384,294 A | 1/1995 | Teowee et al. | |
| 5,391,393 A | 2/1995 | Maniar | |
| 5,962,654 A | 10/1999 | Duncombe et al. | |
| 6,025,619 A | 2/2000 | Azuma et al. | |
| 6,072,688 A * | 6/2000 | Hennings et al. ............ 361/311 |
| 6,207,522 B1 | 3/2001 | Hunt et al. | |
| 6,337,032 B1 | 1/2002 | Chivukula et al. | |
| 6,477,034 B1 | 11/2002 | Chakravorty et al. | |
| 6,541,137 B1 | 4/2003 | Kingon et al. | |

(Continued)

FOREIGN PATENT DOCUMENTS

DE    3800198    7/1988

(Continued)

OTHER PUBLICATIONS

U.S. Appl. No. 10/621,796, filed Jan. 20, 2005, Borland et al.

(Continued)

*Primary Examiner*—Timothy M Speer

(57) ABSTRACT

The present invention is directed to an article comprising a dielectric layer formed from any solution composition that can form barium titanate during firing and containing manganese in an amount between 0.002 and 0.05 atom percent of the solution composition, wherein the dielectric layer has been formed on metal foil and fired in a reducing atmosphere.

14 Claims, 12 Drawing Sheets

U.S. PATENT DOCUMENTS

| | | | |
|---|---|---|---|
| 6,936,301 | B2 | 8/2005 | Maria et al. |
| 7,029,971 | B2 | 4/2006 | Borland et al. |
| 2002/0195612 | A1 | 12/2002 | Farrell |
| 2006/0121258 | A1 | 6/2006 | Kim et al. |

FOREIGN PATENT DOCUMENTS

| | | |
|---|---|---|
| EP | 0581 251 | 2/1994 |
| EP | 058125 | 2/1994 |
| EP | 1 498 944 | 1/2005 |
| FR | 2132326 | 11/1972 |
| JP | 57-187905 | 11/1982 |
| JP | 64-69514 | 3/1989 |
| WO | WO 01/67465 A2 | 9/2001 |

OTHER PUBLICATIONS

X. Li and W. H. Shih, Size Effects in Barium Titanate Particles and Clusters, J. Am. Comm. Soc. 80 (11) 1997, pp. 2844-2852.

M. N. Kamalasanan, N. D. Kumar, and S. Chandra, Structural optical, and dielectric properties of sol-gel derived SrTiO3 thin films, J. Appl. Phys. 74 (1), Jul. 1993, pp. 679-686.

E. Dien, J. B. Briot, M. Lejeune and A. Smith, Relationship Between Processing and lectrical Behavior of BST Films Deposited by Spin Coating, Journal of the European Ceramic Society, vol. 19, (1999), pp. 1349-1352.

M. Losurdo, P. Capezzuto, G. Bruno, G. Perna and V. Capozzi, N2-H2 remote plasma nitridation for GaAs surface passivaton, Applied Physics Letters, vol. 81, No. 1, Jul. 1, 2002, pp. 16-18.

M.N. Kamalasanan, N. Deepak Kumar and Subhas Chandra, Structural and microstructural evolution of barium titanate thin films deposited by the sol-gel process, J. Appl. Phys. 76 (8), Oct. 15, 1994, pp. 4603-4609.

N. Deepak Kumar, M.N. Kamalasanan and Subhas Chandra, Metalorganic chemical vapor deposition technique for growing c-axis oriented ZnO thin films in atmospheric pressure air, Appl. Phys. Lett. 65 (11), Sep. 12, 1994, pp. 1373-1375.

J. T. Dawley and P. G. Clem, Dielectric properties of random and <100> oriented SrTiO3 and (Ba,Sr)TIO3 thin films fabricated on <100>nickel tapes, Applied Physics Letters, vol. 81, No. 16, Oct. 14, 2002, pp. 3028-3030.

G. Arlt. D. Hennings and G. De With, Dielectric properties of fine-grained barium titanate ceramics, J. Appl. Phys. 58 (4), Aug. 15, 1985, pp. 1619-1625.

Angus I. Kingon, Taeyun Kim, Jon-Paul Maria, and Robert Croswell, Integation of Thin Film Capacitors into Polymer-Based Wiring Boards or MCM-Ls, NC State University, Department of Materials Science and Engineering. Jun. 13, 2002.

Angus I. Kingon, Taeyun Kim, Paula Vilarinho, Jon-Paul Maria, and Robert Croswell, Thin Film Capacitors Embedded into High Density Printed Circuit Boards, NC State University, Department of Materials Science and Engineering, Oct. 10, 2001.

Q. Zou, H. E. Ruda and B. G. Yacobi, Dielectric properties of lead zirconate titanate thin films deposited on metal foils, Applied Physics Letters, vol. 77, No. 7, Aug. 14, 2000, pp. 1038-1040.

Q. Zou, H. E. Ruda and B. G. Yacobi, Improved dielectric properties of lead zirconate titanate thin films deposited on metal foils with LaNiO3 buffer layers, Applied Physics Letters, vol. 78, No. 9, Feb. 2001, pp. 1282-1284.

Butrand Lee, Jianping Zhang, Preparation, structure evolution and dielectric properties of BaTiO3 thin films and powders by an aqueous sol-gel process, Thin Solid Films, 388 (20001), pp. 107-113.

M. H. Frey and D. A. Payne, Nanocrystalline barium titanate: Evidence for the absence of ferroelectricity in sol-gel derived thin-layer capacitors, Appl. Phys. Lett 63 (20), Nov. 15, 1993, pp. 2753-2755.

M. H. Frey and D. A. Payne, Grain-size effect on structure and phase transformations for barium titanate, Physical Review B, vol. 54, No. 5, Aug. 1, 1996-1, pp. 3158-3168.

R. W. Schwartz, P. G. Clem, J. A. Voigt, E. R. Byhoff, M. Van Stry, T. J. Headley and N. A. Missert, Control of Microstructure and Orientation in Solution-Deposited BaTiO3 and SrTiO3 Thin Films, J. Am. Ceram. Soc., vol. 82, No. 9, (1999), pp. 2359-2367.

Danielle M. Tahan, Ahmad Safari and Lisa C. Klein, Preparation and Characterization of BaxSr1-xTiO3 Thin Films by a Sol-Gel Technique, J. Am. Ceram. Soc., vol. 79, No. 6, (1996), pp. 1593-1598.

Jon-Paul Maria, Kevin Cheek, Stephen Streiffer, Seung-Hyun Kim, Greg Dunn and Angus Kingon, Lead Zirconate Titanate Thin Films on Base-Metal Foils; An Approach for Embedded High-Permittivity Passive Components, J. Am. Ceram. Soc. 84 (10), 2001, pp. 2436-2438.

W. J. Lee and H. G. Kim, Microstructure dependence of electrical properties of (Ba0.5Sr0.5)TiO3 thin films deposited on Pt/SiO2/Si, J. Appl. Phys. 80 (10), Nov. 15, 1996, pp. 5891-5894.

M. N. Kamalasaan, N. D. Kumar and S. Chandra, Dielectric and ferroelectric properties of BaTiO3 thin films grown by the sol-gel process, J. Appl. Phys. 74 (9), Nov. 1, 1983, pp. 5679-5686.

D.M. Smyth, Barium Titanantes, The Defect Chemistry of Metal Oxides, Oxford University Press, 200, pp. 252-282.

Angus I. Kingon, Taeyun Kim, Jon-Paul Maria, and Robert Croswell, Integration of Thin Film Capacitors into Polymer-Based Wiring Boards or MCM-Ls, NC State University, Department of Materials Science and Engineering. Jun. 13, 2002.

International Search Report and Written in corresponding PCT Application No. PCT/US2006/024008, dated Nov. 11, 2006.

\* cited by examiner

ARTICLES COMPRISING MANGANESE DOPED BARIUM TITANATE THIN FILM COMPOSITIONS

CROSS REFERENCE TO RELATED APPLICATIONS

This application claims the benefit of priority from, and is a divisional of, U.S. application Ser. No. 11/157,621, filed 21 Jun. 2005, and now pending.

TECHNICAL FIELD

The present invention pertains to thin film capacitors, more particularly to thin film capacitors formed on copper foil that can be embedded in printed wiring boards (PWB) to provide capacitance for decoupling and controlling voltage for integrated circuit die that are mounted on the printed wiring board package.

BACKGROUND

As semiconductor devices including integrated circuits (IC) operate at higher frequencies, higher data rates and lower voltages, noise in the power and ground (return) lines and supplying sufficient current to accommodate faster circuit switching becomes an increasingly important problem requiring low impedance in the power distribution system. In order to provide low noise, stable power to the IC, impedance in conventional circuits is reduced by the use of additional surface mount technology (SMT) capacitors interconnected in parallel. The higher operating frequencies (higher IC switching speeds) mean that voltage response times to the IC must be faster. Lower operating voltages require that allowable voltage variations (ripple) and noise become smaller. For example, as a microprocessor IC switches and begins an operation, it calls for power to support the switching circuits. If the response time of the voltage supply is too slow, the microprocessor will experience a voltage drop or power droop that will exceed the allowable ripple voltage and noise margin and the IC will trigger false gates. Additionally, as the IC powers up, a slow response time will result in power overshoot. Power droop and overshoot must be controlled within allowable limits by the use of capacitors that are close enough to the IC that they provide or absorb power within the appropriate response time. This power droop and overshoot are maintained within the allowable limits by the use of capacitors providing or absorbing power in the appropriate response time.

Capacitors for decoupling and dampening power droop or overshoot are generally placed as close to the IC as possible to improve their performance. Conventional designs have capacitors surface mounted on the printed wiring board (PWB) clustered around the IC. In this case, large numbers of capacitors requires complex electrical routing which leads to inductance. As frequencies increase and operating voltages continue to drop, power increases and higher capacitance has to be supplied at increasingly lower inductance levels. A solution would be to incorporate a high capacitance density, thin film ceramic capacitor in the PWB package onto which the IC is mounted. A single layer ceramic capacitor directly under the IC reduces the inductance to as minimum as possible and the high capacitance density provides the capacitance to satisfy the IC requirements. Such a capacitor in the PWB can provide capacitance at a significantly quicker response time and lower inductance.

Embedding ceramic capacitor films in printed wiring boards is known. Capacitors are initially formed on metal foils by depositing a capacitor dielectric material on the foil and annealing it at an elevated temperature. A top electrode is formed on the dielectric to form a fired capacitor on foil structure. The foil is then bonded to an organic laminate structure to create an inner layer panel wherein the capacitor is embedded in the panel. These inner layer panels are then stacked and connected by interconnection circuitry, the stack of panels forming a multilayer printed wiring board.

A high capacitance density capacitor can be achieved by use of a dielectric with a high permittivity or dielectric constant (K) and a thin dielectric. High dielectric constants are well known in ferroelectric ceramics. Ferroelectric dielectric materials with high dielectric constants include perovskites of the general formula $ABO_3$ in which the A site and B site can be occupied by one or more different metals. For example, high K is realized in crystalline barium titanate (BT), lead zirconate titanate (PZT), lead lanthanum zirconate titanate (PLZT), lead magnesium niobate (PMN) and barium strontium titanate (BST) and these materials are commonly used in surface mount component devices. Barium titanate based compositions are particularly useful as they have high dielectric constants and they are lead free.

Thin film capacitor dielectrics with a thickness of less than 1 micron are well known. Thin films can be deposited on to a substrate by sputtering, laser ablation, chemical vapor deposition, and chemical solution deposition. Initial deposition is either amorphous or crystalline depending upon deposition conditions. Amorphous compositions have low K (approximately 20) and have to be annealed at high temperatures to induce crystallization and produce the desired high K phase. The high K phase in barium titanate based dielectrics can only be achieved when grain sizes exceed 0.1 micron and so annealing temperatures as high as 900° C. may be used.

Chemical solution deposition (CSD) techniques are commonly used to form thin film capacitors on metal foils. CSD techniques are desirable due to their simplicity and low cost. High temperature annealing of barium titanate thin CSD films formed on base metal foils such as copper or nickel, require low oxygen partial pressures to avoid oxidation of the metal. The low oxygen partial pressures, however, often result in high leakage currents under applied bias (current densities) in barium titanate based compositions due to reduction of the dielectric material. In worst case situations, the capacitor may be shorted and dielectric properties cannot be measured. This may be addressed by a subsequent re-oxidation procedure carried out at lower temperatures in which the dielectric and metal foil is exposed to higher partial pressures of oxygen but this results in oxidation of the base metal foil.

A barium titanate CSD composition is disclosed in U.S. National patent application Ser. No. 10/621,796 (U.S. Patent Publication No. 2005-001185). The composition is particularly suitable for forming high capacitance density, ceramic films on copper foil. The precursor composition consists of the following chemicals:

| | |
|---|---|
| Barium acetate | 2.6 g |
| Titanium isopropoxide | 2.9 ml |
| Acetylacetone | 2.0 ml |
| Acetic acid | 10.0 ml |
| Methanol | 15 ml |

However, when annealed at 900° C. in a partial pressure of oxygen of approximately $10^{-11}$ atmospheres, the film was conducting and a re-oxidation procedure was necessary to produce parts from which electrical data could be taken. This procedure oxidized the foil and did not necessarily produce optimum capacitor performance, particularly with respect to leakage current density under bias. It is also not cost effective to re-oxidize the dielectric in a separate step. It would be an advantage, therefore, if the barium titanate composition could be doped to produce good electrical performance, particularly a low leakage current density under bias, immediately after the low oxygen partial pressure annealing process.

SUMMARY OF THE INVENTION

Described herein is an article comprising a dielectric layer formed from any solution composition that can form barium titanate during firing and containing manganese in an amount between 0.002 and 0.05 atom percent of the solution composition, wherein the dielectric layer has been formed on metal foil and fired in a reducing atmosphere.

Also described herein include a capacitor comprising the article and a printed wiring board comprising the article. to Furthermore, the present invention is also directed to an innerlayer panel and a printed wiring board comprising such a capacitor.

BRIEF DESCRIPTION OF THE DRAWINGS

The detailed description will refer to the following drawings, wherein like numerals refer to like elements, and wherein.

DETAILED DESCRIPTION

Figure 1:
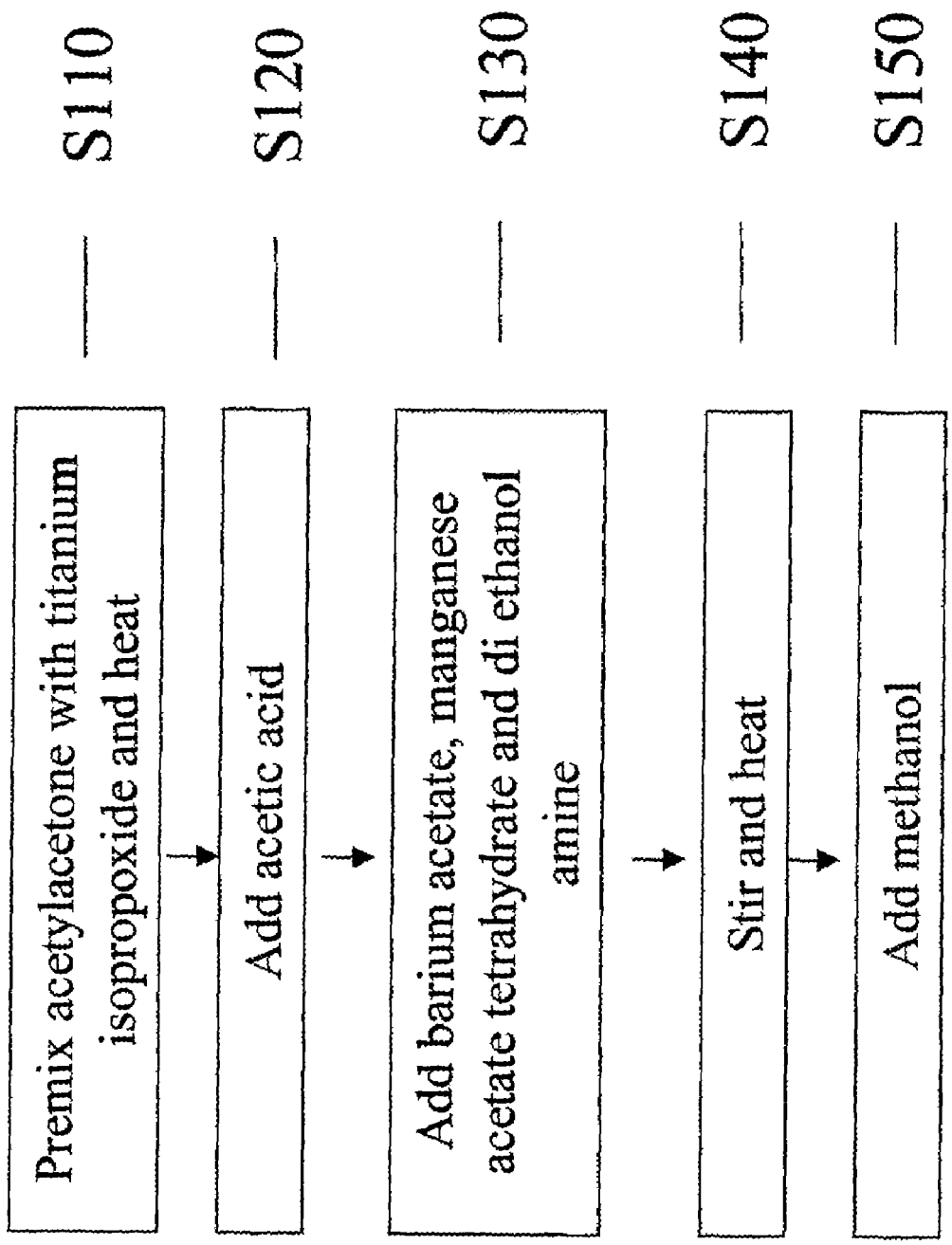
FIG. 1 is a block diagram illustrating a process for preparing a precursor solution used to form a dielectric that does not require a re-oxidation process.

High capacitance density thin film dielectrics and methods of making thereof are disclosed. The manganese doped barium titanate dielectric according to the present invention may have essentially the same capacitance density and loss tangent as undoped barium titanate after re-oxidation. The manganese doped barium titanate dielectric when processed without a re-oxidation procedure, however, has a much lower leakage current density under bias than re-oxidized pure barium titanate.

$BaTiO_3$ is a preferred core material in the formation of high capacitance density dielectrics according to the present invention. However, metal cations with the oxide stoichiometry of $MO_2$ may also be used to partially or substantially substitute for titanium (e.g., Zr, Hf, Sn and mixtures thereof). While the terms "partially" and "substantially" are not meant to be particularly limiting, there are various preferred embodiments. In one embodiment, "partially" is defined as up to and including 10 molar percent of the titanium. In one embodiment, "substantially" is defined as up to and including 50 molar percent of the titanium. These broaden the temperature dependence of capacitance at the Curie point in the dielectric by "pinching" (shifting) the three phase transitions of $BaTiO_3$ closer to one another in temperature space. Metal cations having the oxide stoichiometry of MO (e.g., Pb, Ca, Sr and mixtures thereof) may also be used to partially or substantially substitute for barium. While the terms "partially" and "substantially" are not meant to be particularly limiting, there are various preferred embodiments. In one embodiment, "partially" is defined herein as up to and including 10 molar percent of the barium. In one embodiment, "substantially" is defined as up to and including 50 molar percent of the barium. These cations shift the dielectric Curie point to higher or lower temperatures depending upon the material used.

According to a first embodiment, a high capacitance density thin film CSD dielectric composition is disclosed that eliminates the requirement of a re-oxidation procedure after annealing the dielectric layer at a temperature in the range of approximately about 800 to 1050° C. under a low partial pressure of oxygen of less than about $10^{-8}$ atmospheres. In one embodiment, a high capacitance density thin film CSD dielectric composition is disclosed that eliminates the requirement of a re-oxidation procedure after annealing the dielectric layer at a temperature in the range of approximately about 900° C. under a low partial pressure of oxygen of approximately $10^{-11}$ atmospheres.

Capacitors constructed according to the above method can be embedded into innerlayer panels, which may in turn be incorporated into printed wiring boards. The capacitors have high capacitance densities, low loss tangents, and low leakage current densities under bias. Further, the methods according to the present invention may be practiced without the use of a re-oxidation treatment while using environmentally desirable materials.

The capacitor embodiment discussed herein has a dielectric thickness in the range of about 0.4 to 1.0 μm with a capacitance density of approximately 2.5 μF/cm². Capacitors of this capacitance density range have a breakdown voltage in excess of about 20 volts.

Manganese doped crystalline barium titanate is used to form high permittivity dielectric films or layers in the capacitor embodiments discussed in this specification. Manganese doped crystalline barium titanate films enables high capacitance density devices to be fabricated. The high capacitance density can be achieved using dielectric thicknesses that are physically robust, preferably between 0.4 to 1.0 µm. Manganese doping with as little as 250 ppm can be used to create the high dielectric constant dielectrics that are compatible with processing without re-oxidation procedures.

Chemical solution deposition (CSD) techniques may be used to form the dielectric. CSD techniques are desirable due to their simplicity and low cost. The chemical precursor solution from which doped $BaTiO_3$ is prepared preferably contains barium acetate, titanium isopropoxide, acetylacetone, acetic acid, methanol, diethanolamine, and manganese acetate tetrahydrate.

For a stable precursor solution, the above chemicals should be free of water. Water de-stabilizes the precursor composition, resulting in precipitation of titanium oxide. It is therefore important to prepare and deposit the precursor solution in relatively low humidity environments, such as less than about 40 percent relative humidity. Once the precursor solution has been fully deposited on the metal foil and dried, it is less susceptible to humidity.

FIG. 1 is a block diagram illustrating a process for preparing a precursor solution that will be used to form a dielectric according to the present invention. In step S110, titanium isopropoxide is premixed with acetyl acetone and heated. The premix can be done in, for example, a PYREX® container, and heating may take place on a hot plate with a surface temperature of about 90° C. In step S120, acetic acid is added to the Ti isopropoxide/acetylacetone mixture. In step S130, barium acetate and manganese acetate tetrahydrate is added into the container, and stirred until they are dissolved. In step S140, the solution is stirred while heated at 90° C. for a heating time of about 1 hour. In step S150, methanol is added to the solution to yield approximately a 0.3 molar concentration. The precursor solution is now suitable for deposition.

Figure 2:
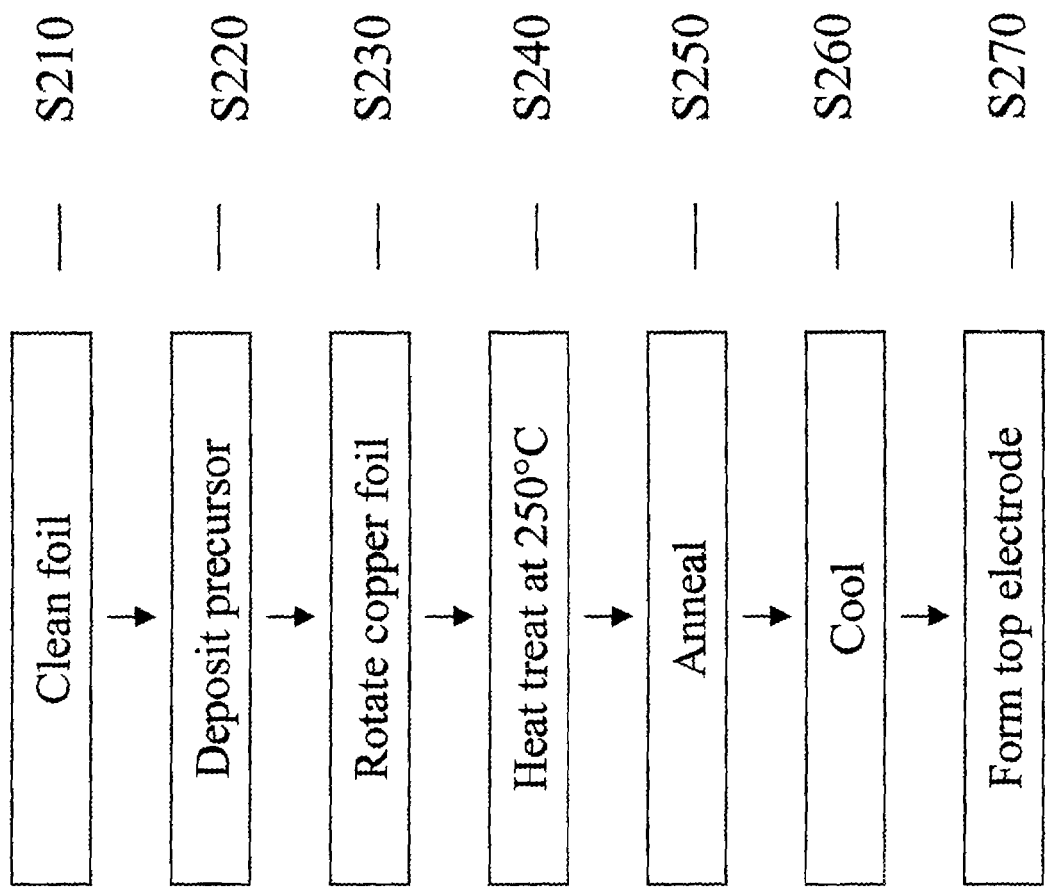
FIG. 2 is a block diagram illustrating a process for making a capacitor on copper foil.

FIG. 2 is a block diagram of a method suitable for forming a capacitor according to the present invention. The dielectric of the resultant capacitor may be formed using the precursor solution discussed above with reference to FIG. 1. Variants of the methanol and the acetylacetone components in the above-described precursor solution may also be used. For example, methanol may be substituted with acetic acid. Methanol may also be substituted by ethanol, isopropanol, acetone, butanol and other alcohols. Acetylacetone may be substituted by ethanolamines such as 3-ethanolamine, diethanolamine or mono-ethanolamine, for example. Titanium isopropoxide may also be substituted by titanium butoxide, for example.

The deposition process illustrated in FIG. 2 is spin coating. Other coating methods, such as dip or spray coating, are also feasible. In step S210, a metallic foil may be cleaned. Cleaning is not always necessary but may be advisable. The metallic foil may be made from copper. Copper foils are desirable due their low cost and ease of handling. The copper foil will serve as a substrate on which a capacitor is built. The copper foil also acts as a capacitor "bottom" electrode in the finished capacitor. In one embodiment, the substrate is an 18 µm thick electroless, bare copper foil. Other untreated foils, such as 1 oz copper foil, are also suitable. Suitable cleaning conditions include etching the foil for 30 seconds in a dilute solution of copper chloride in hydrochloric acid. The etching solution may be diluted approximately 10,000 times from its concentrated form. The cleaning process removes the excess oxide layer, fingerprints and other accumulated foreign matter from the foil. If the copper foil is received from a vendor or other source in a substantially clean condition, and is handled carefully and promptly used, the recommended cleaning process may not be necessary.

The copper foil is preferably not treated with organic additives. Organic additives are sometimes applied in order to enhance adhesion of a metallic substrate to epoxy resins. Organic additives, however, may degrade the dielectric film during annealing.

In step S220, the precursor solution discussed above with reference to FIG. 1 is deposited over the drum side (or "smooth side") of the copper foil substrate. The precursor solution may be applied using, for example, a plastic syringe.

In step S230, the substrate is rotated for spin coating. A suitable rotation time and speed are 30 seconds at 3000 revolutions per minute. In step S240, the substrate is heat-treated. Heat treatment may be performed, for example, at a temperature of 250° C. for five to ten minutes. Heat treatment is used to dry the precursor solution by evaporating solvents in the precursor solution. After heat treatment, the dried dielectric precursor layer is about 150 nm thick. Consecutive spinning steps may be used to coat the foil substrate to the desired thickness. Three spinning steps, for example, may be used to produce a final dried dielectric precursor thickness of approximately 0.5 µm.

In step S250, the coated substrate is annealed. Annealing first removes residual organic material, and then sinters, densifies and crystallizes the dried dielectric precursor. Annealing may be conducted in a high temperature, low oxygen partial pressure environment. A suitable total pressure environment is about 1 atmosphere. A suitable oxygen partial pressure is about $10^{-10}$ to $10^{-11}$ atmospheres.

In step S250, the low oxygen partial pressure may be achieved by bubbling high purity nitrogen through a controlled temperature water bath. Other gas combinations are also possible. In one embodiment, the furnace temperature is at least about 900° C., and the oxygen partial pressure is approximately $10^{-11}$ atmospheres. The water bath may be at a temperature of about 25° C. The annealing can be performed by inserting the coated foil substrate into a furnace at temperatures below 250° C. The furnace is then ramped up to 900° C. at a rate of about 30° C./minute. The furnace is maintained at 900° C. for 30 minutes.

In step S260, the foil substrate is allowed to cool. Cooling may be governed by a Newtonian profile, for example, created by simply switching the furnace off. Alternatively, the furnace temperature may be ramped down at a specific rate. When the furnace temperature reaches about 450° C., the foil substrate may be safely removed from the furnace without risk of undesired oxidation effects on the copper foil. Alternatively, the furnace may be allowed to return to room temperature before the foil substrate is removed from the furnace.

In the low oxygen partial pressure annealing process, the copper foil is not oxidized to $Cu_2O$ or $CuO$. This resistance to oxidation is due to the low oxygen pressure and high processing temperature. The dielectric is also not reduced and maintains its good electrical characteristics, particularly a low leakage current density under bias. This resistance to reduction is due to the manganese acceptor doping. With manganese doping, conduction electrons are trapped by the manganese so that a decrease in insulation resistance and increase in dielectric losses are suppressed.

The high temperature annealing of 900° C. described above for densification and crystallization of the deposited dielectric provides desirable physical properties and desirable electrical properties. One desirable physical property is a dense microstructure. Another desirable physical property is resultant grain sizes between 0.1 µm and 0.2 µm. One desirable electrical property resulting from the grain size is a capacitance density in excess of 1 $\mu F/cm^2$. An additional desirable property is a low loss tangent, which may be less than 2.5 percent. In general, dielectric constants of polycrystalline $BaTiO_3$ based materials fall precipitously when the average grain size falls below 0.1 µm, and grain sizes of at least this order are therefore desirable.

In step 270, top electrodes are formed over the resulting dielectric. The top electrode can be formed by, for example, sputtering, combustion vapor deposition, electroless plating, printing or other suitable deposition methods. In one embodiment, sputtered platinum electrodes are used. Other suitable materials for the top electrode include nickel, copper, and palladium. The top electrodes may be plated with copper to increase thickness, if desired.

EXAMPLE 1

A thin film un-doped pure barium titanate film was prepared on a copper foil using a precursor as disclosed in U.S. National patent application Ser. No. 10/621,796 (U.S. Patent Publication No. 2005-001185). The copper foil was coated with the dielectric precursor composition using the method outlined in FIG. 2. The composition of the dielectric precursor was as given below:

| | |
|---|---|
| Barium acetate | 2.6 g |
| Titanium isopropoxide | 2.9 ml |
| Acetylacetone | 2.0 ml |
| Acetic acid | 10.0 ml |
| Methanol | 15 ml |

Three spin coats were applied. The coated copper foil was annealed at 900° C. for 30 minutes under a partial pressure of oxygen of approximately $10^{-11}$ atmospheres. After annealing, the pure barium titanate was re-oxidized by placing the foil in a vacuum chamber under an atmosphere of approximately $10^{-5}$ Torr of oxygen at 550° C. for 30 minutes. This condition was chosen to avoid significant oxidation of the copper foil while still providing oxygen for re-oxidation of the dielectric. After re-oxidation, a top platinum electrode was sputtered on to the dielectric and the capacitance, dissipation factor and leakage current density under bias could be measured.

Figure 3:
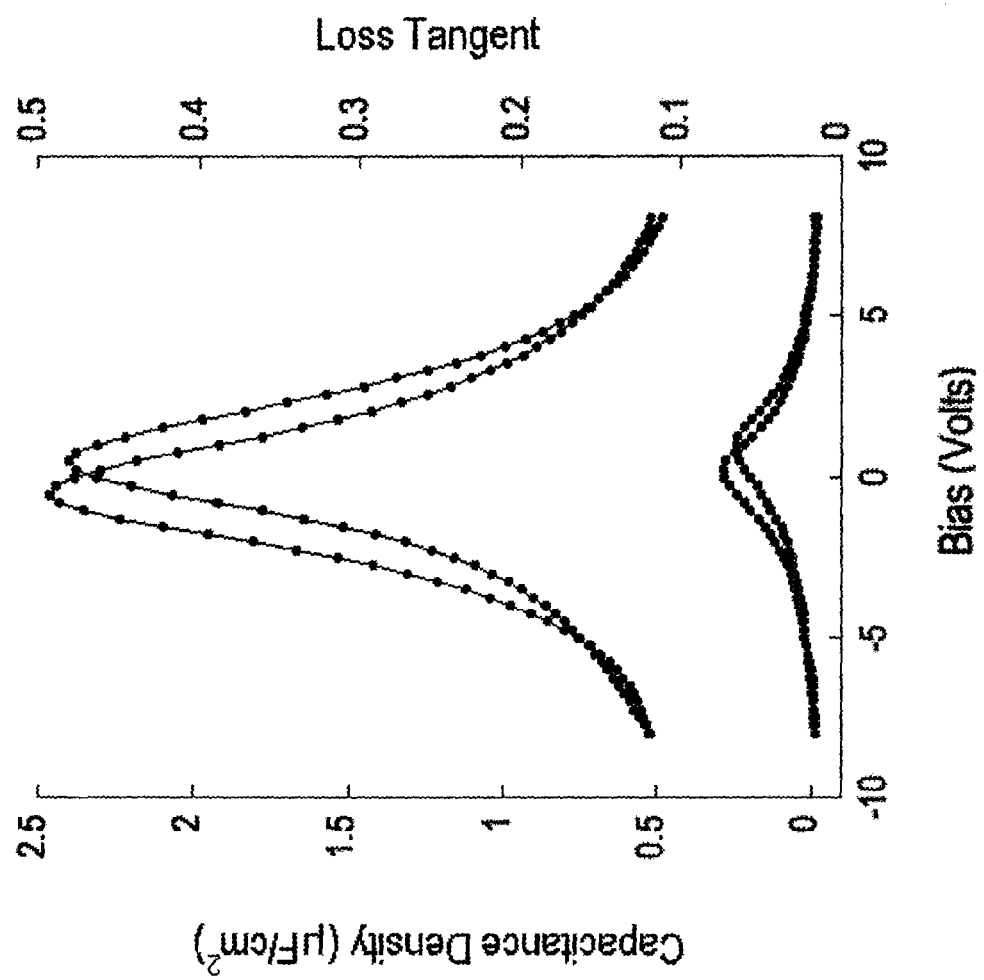
FIG. 3 is a graph showing capacitance density and loss tangent as a function of voltage for pure barium titanate after re-oxidation.
Figure 4:
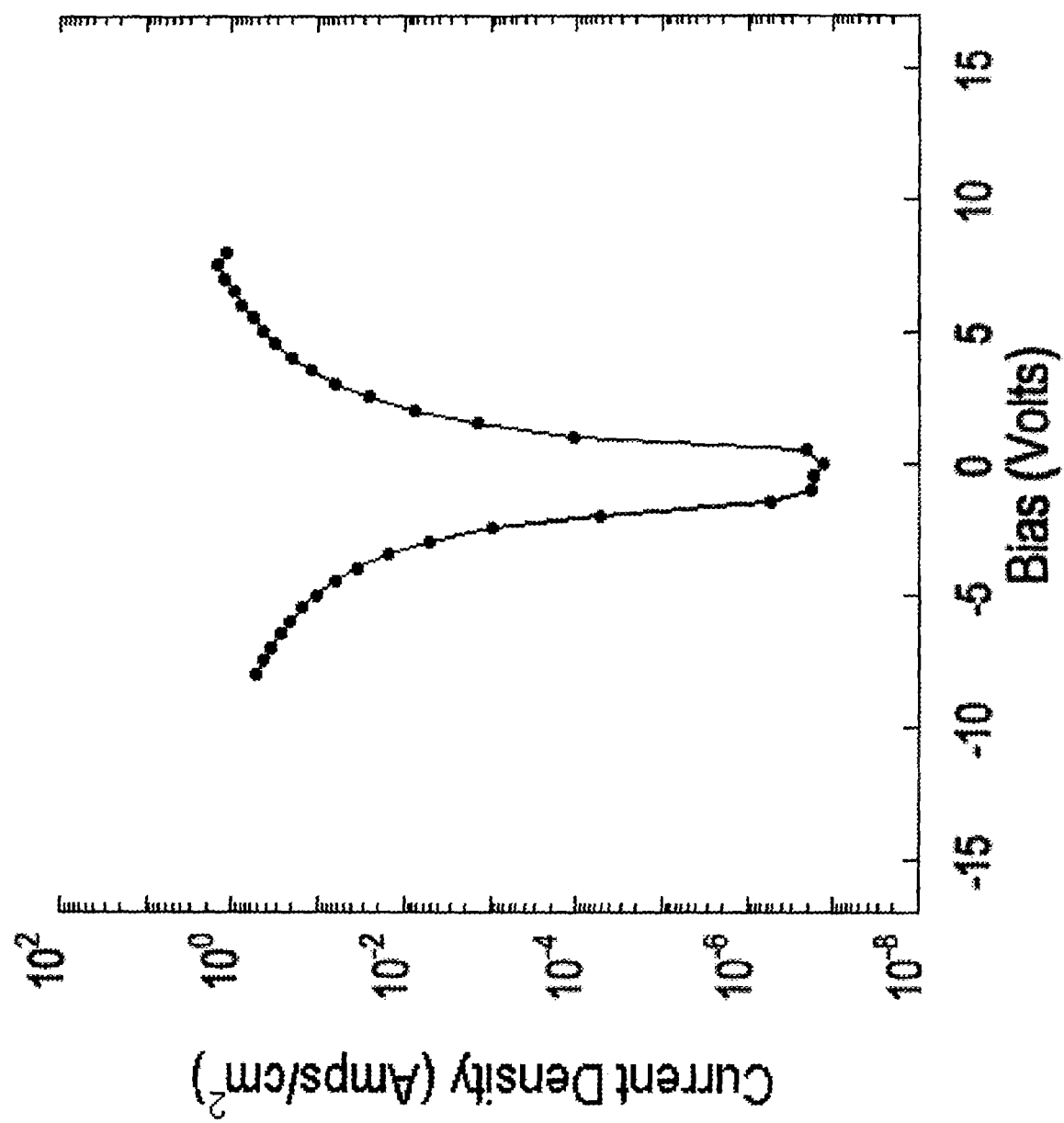
FIG. 4 is a graph showing leakage current density as a function of voltage for undoped pure barium titanate after re-oxidation.

As shown in FIG. 3, at zero bias, the capacitance density was approximately 2.5 µF/cm² and the loss tangent was approximately 5 percent, but the pure barium titanate layer exhibited high leakage current densities of the order of 1 amp per cm² under 10 volts bias as shown in FIG. 4.

EXAMPLE 2

A thin film 0.01 atom percent manganese doped barium titanate film was prepared on a copper foil. The copper foil was coated with the dielectric precursor composition using the method outlined in FIG. 2. The composition of the dielectric precursor was as given below:

| | |
|---|---|
| Barium acetate | 5.08 g |
| Titanium isopropoxide | 5.68 ml |
| Acetylacetone | 3.86 ml |
| Acetic acid | 21 ml |
| Methanol | 24.26 ml |
| Manganese acetate | 0.002 g |
| Diethanolamine | 0.54 g |

The only difference in inorganic levels between example 1 and example 2 is the manganese. The diethanolamine is a stress reducing organic material and has no effect on the final inorganic composition. Three spin coats were applied. The coated copper foil was annealed at 900° C. for 30 minutes at a partial pressure of oxygen of approximately $10^{-11}$ atmospheres. A top platinum electrode was sputtered on to the dielectric and the electrical characteristics of the capacitor were measured.

Figure 5:
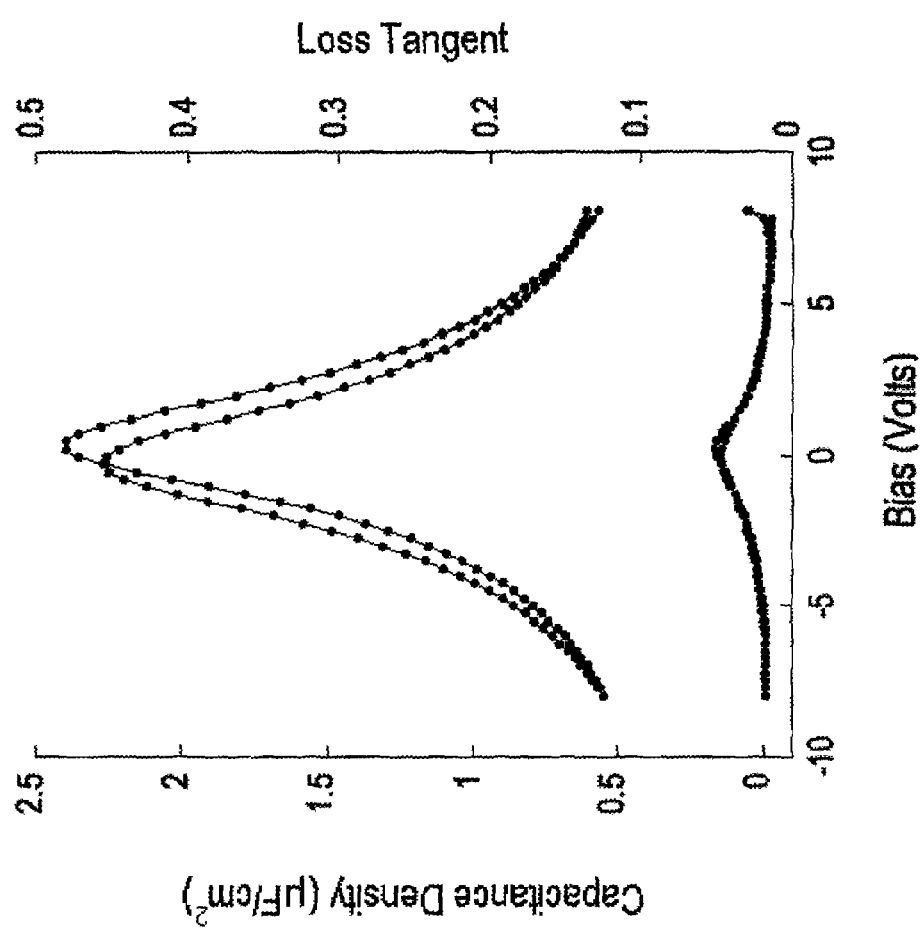
FIG. 5 is a graph showing capacitance density and loss tangent as a function of voltage for 0.01 atom percent manganese doped barium titanate without re-oxidation.
Figure 6:
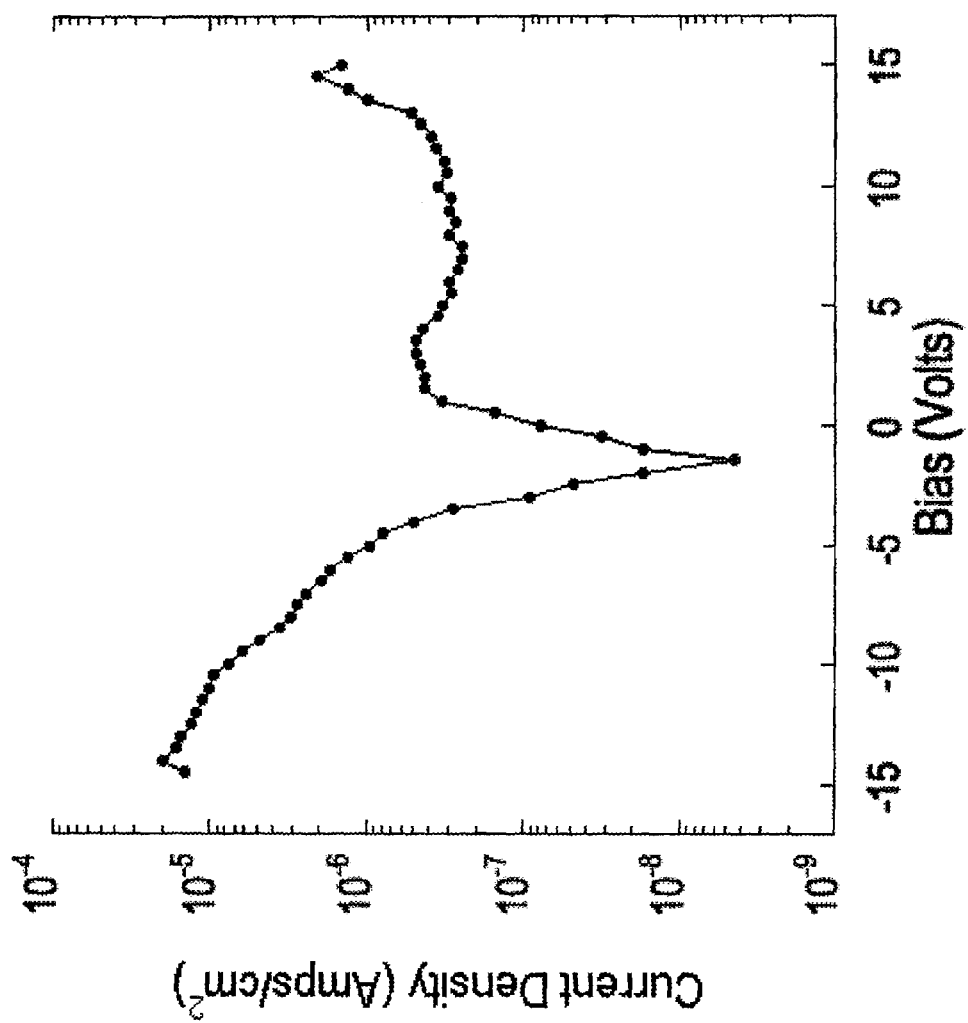
FIG. 6 is a graph showing leakage current density as a function of voltage for 0.02 atom percent manganese doped barium titanate without re-oxidation.

As shown in FIG. 5, the doped barium titanate layer without re-oxidation exhibited a similar capacitance density and loss tangent to that of the re-oxidized pure barium titanate. However, as shown in FIG. 6, the manganese doped barium titanate without a re-oxidation showed a low leakage current density of approximately 10 micro-amps per cm² at 10 volts bias or approximately 10,000 times lower leakage current flow versus the re-oxidized undoped barium titanate.

EXAMPLE 3

A 0.02 atom percent manganese doped barium titanate thin film was prepared on a copper foil in the similar manner described in EXAMPLE 1 using the precursor solution described below except the coating/pre-baking process was repeated six times. The manganese dopant solution was prepared by dissolving Mn(OAc)₂ (0.2 g) in hot acetic acid (29.8 g):

| | |
|---|---|
| Barium acetate | 2.0 g |
| Titanium isopropoxide | 2.22 g |
| Acetylacetone | 1.56 g |
| Acetic acid | 17.0 g |
| Diethanolamine | 0.21 g |
| Manganese dopant solution | 0.17 g |

Figure 7:
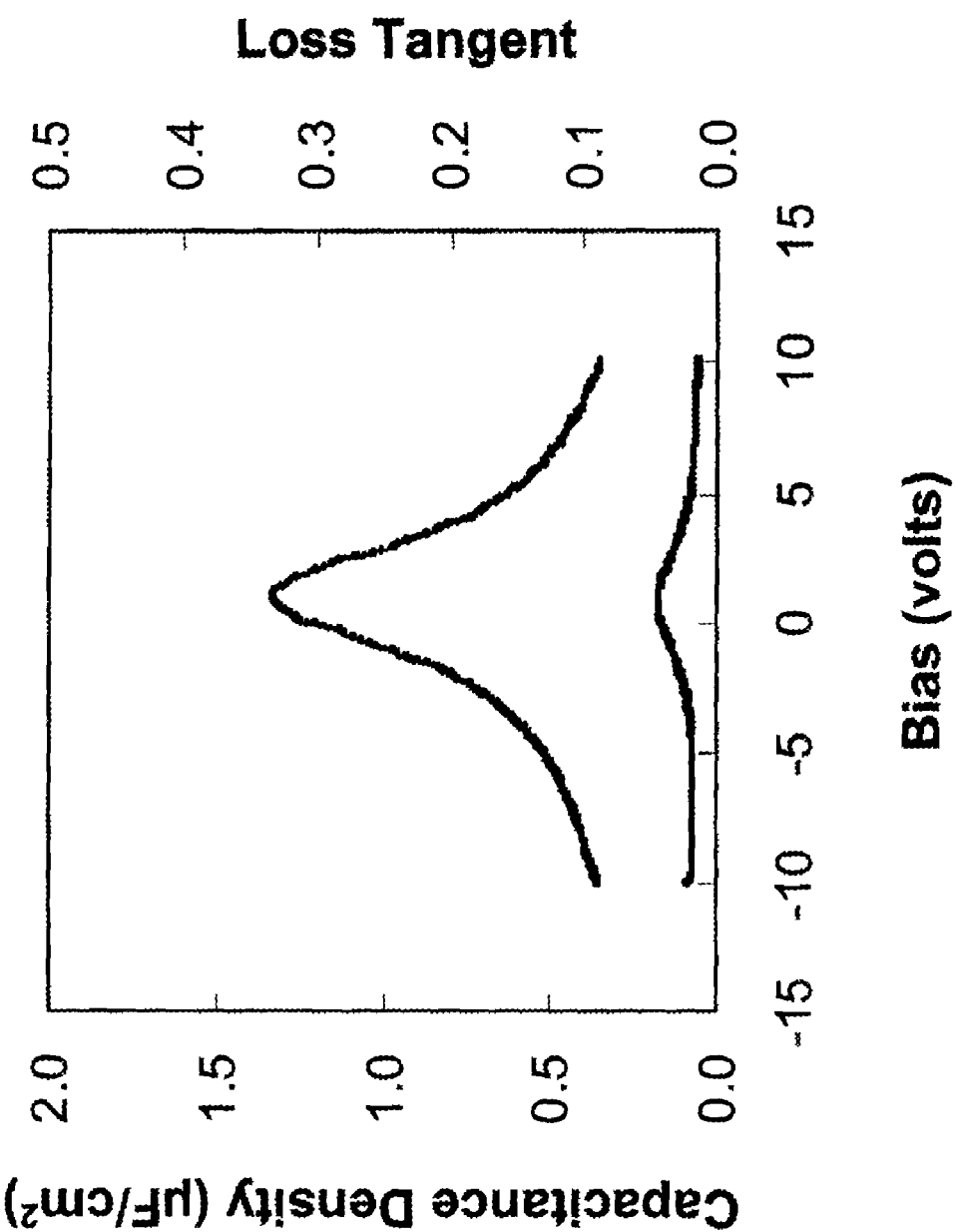
FIG. 7 is a graph showing capacitance density and loss tangent as a function of voltage for 0.02 atom percent manganese doped barium titanate without re-oxidation
Figure 8:
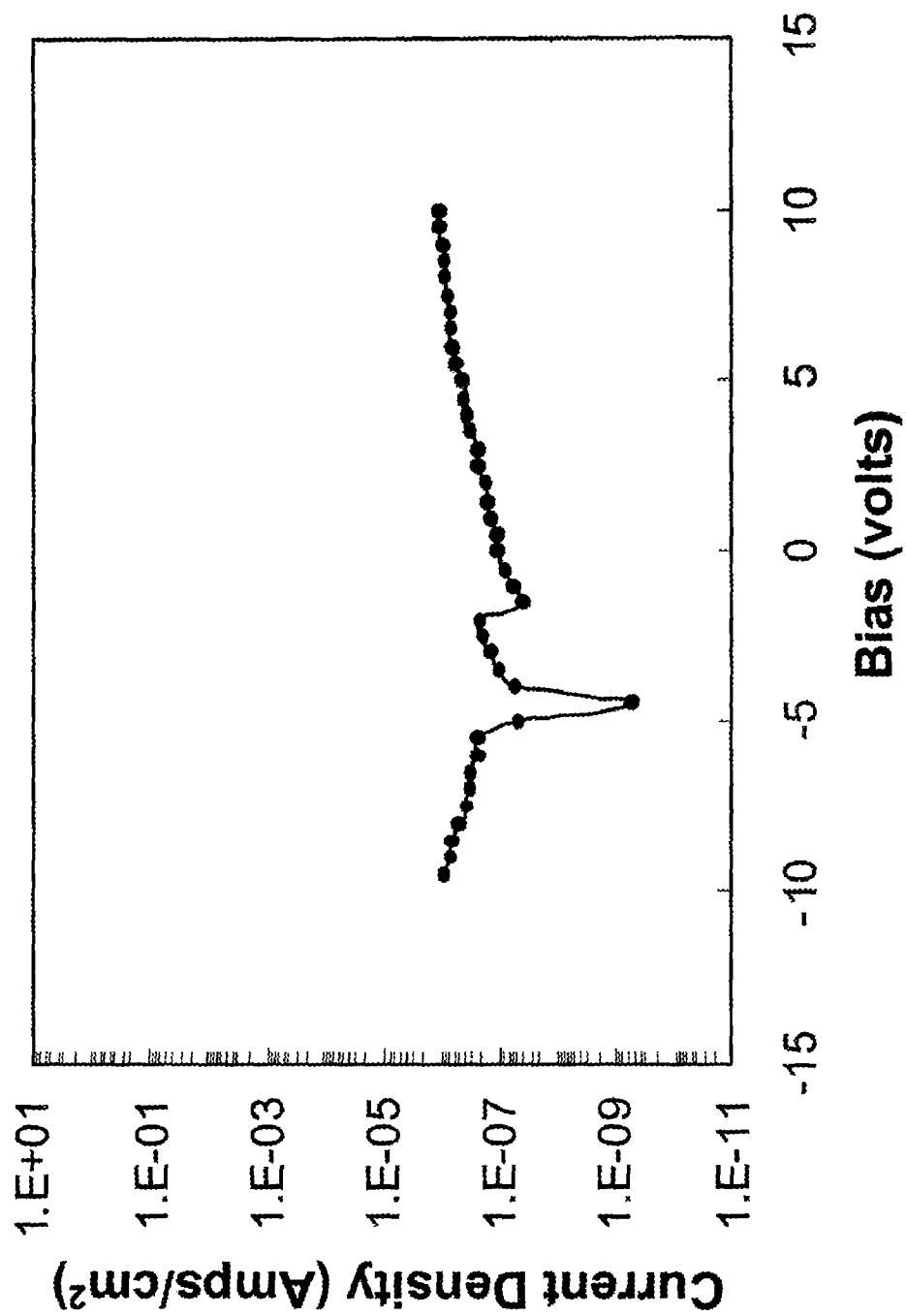
FIG. 8 is a graph showing leakage current density as a function of voltage for 0.02 atom percent manganese doped barium titanate without re-oxidation.

The capacitance density and loss tangent for a manganese doped barium titanate layer without re-oxidation are shown in FIG. 7. The capacitance density was approximately 1.4 µF/cm² at 0 volt and the loss tangent was <5 percent and the dissipation factor did not degrade under bias. The lower capacitance density versus examples 1 and 2 were as a result of twice the number of coatings giving a substantially thicker dielectric. As shown in FIG. 8, the 0.02 atom percent manganese doped barium titanate without an oxidation procedure showed a low leakage current density of approximately 10 micro-amps/cm² at 10 volts bias or approximately 1,000,000 times lower leakage current flow versus the re-oxidized undoped barium titanate.

EXAMPLE 4

A 0.04 atom percent manganese doped barium titanate thin film was prepared on a copper foil in the similar manner described in EXAMPLE 3 using the precursor solution described below. The coating/pre-baking process was repeated six times. The manganese dopant solution was prepared by dissolving Mn(OAc)₂ (0.2 g) in hot acetic acid (29.8 g):

| | |
|---|---|
| Barium acetate | 2.0 g |
| Titanium isopropoxide | 2.22 g |
| Acetylacetone | 1.56 g |
| Acetic acid | 17.0 g |
| Diethanolamine | 0.21 g |
| Manganese dopant solution | 0.42 g |

Figure 9:
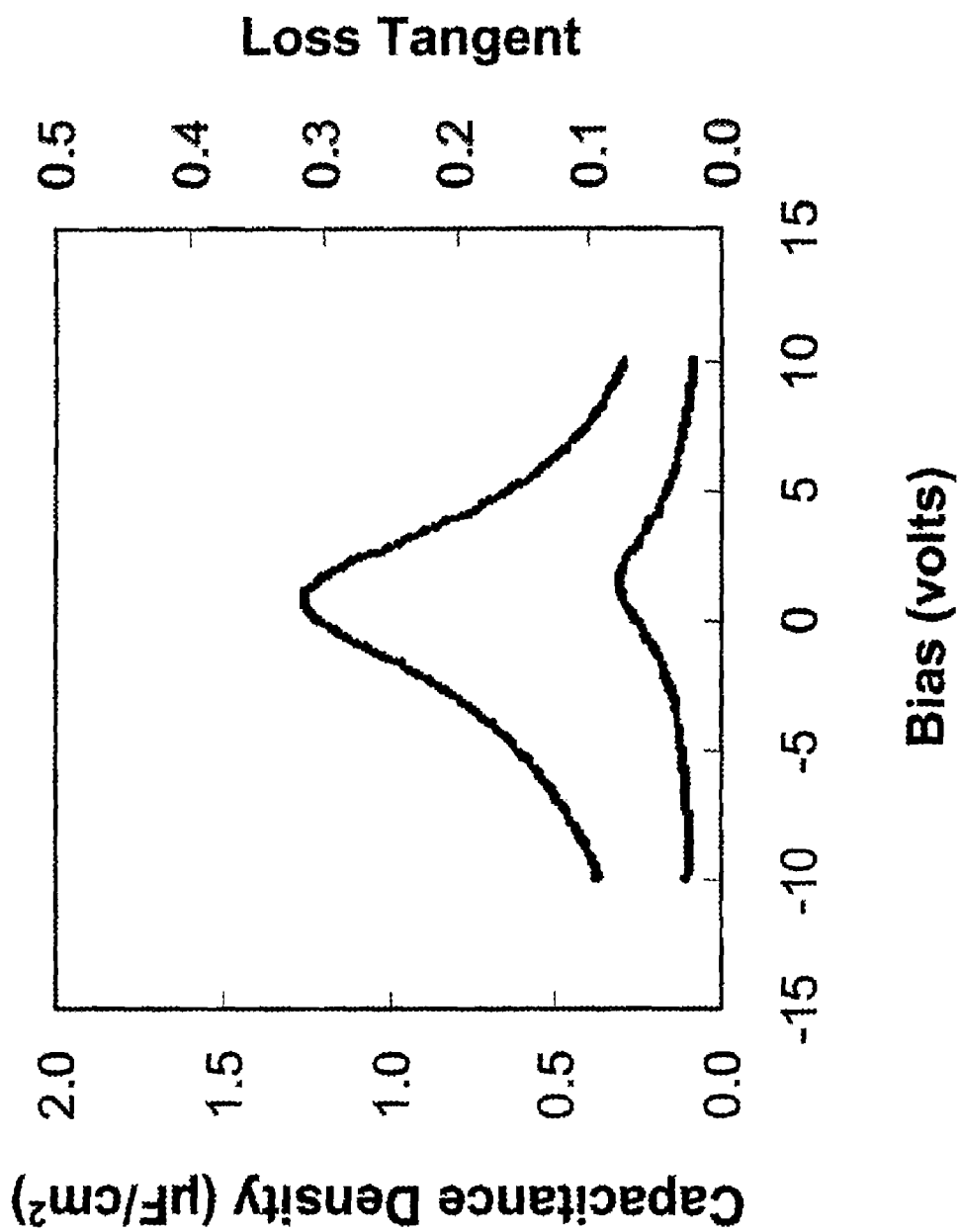
FIG. 9 is a graph showing capacitance density and loss tangent as a function of voltage for 0.04 atom percent manganese doped barium titanate without re-oxidation.
Figure 10:
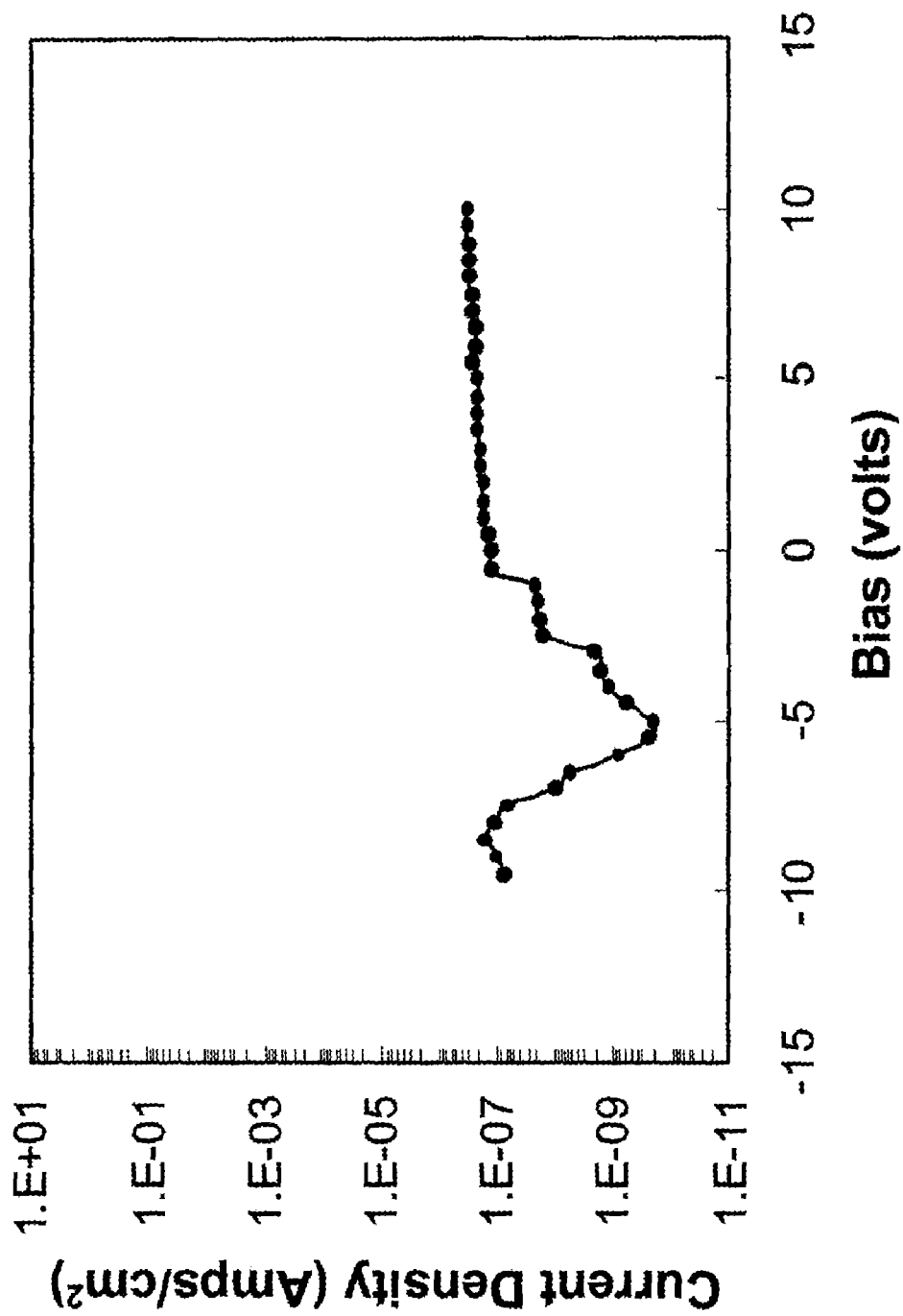
FIG. 10 is a graph showing leakage current density as a function of voltage for 0.04 atom percent manganese doped barium titanate without re-oxidation.

The capacitance density and loss tangent for a manganese doped barium titanate layer without re-oxidation are shown in FIG. 9. The capacitance density was approximately 1.3

μF/cm² at 0 volt and the loss tangent was ≦8 percent and the dissipation factor did not degrade under bias. As in example 3, the lower capacitance density was as a result of a thicker dielectric. As shown in FIG. 10, the 0.04 atom percent manganese doped barium titanate without an oxidation procedure showed a low leakage current density of approximately 10 micro-amps/cm² at 10 volts bias or approximately 1,000,000 times lower leakage current flow versus the re-oxidized undoped barium titanate.

EXAMPLE 5

A 0.01 atom percent manganese doped barium strontium titanate ($Ba_{0.65}Sr_{0.35}TiO_3$) thin film was prepared on a copper foil in the similar manner described in EXAMPLE 3 except the strontium acetate was also added at the same time as the barium acetate using the precursor solution described below. The coating/pre-baking process was repeated six times. The manganese dopant solution was prepared by dissolving manganese acetate tetrahydrate (0.29 g) in a mixture of acetic acid (27.71 g) and distilled water (2.0 g):

| | |
|---|---|
| Barium acetate | 7.45 g |
| Strontium acetate | 3.17 g |
| Titanium isopropoxide | 12.67 g |
| Acetylacetone | 8.93 g |
| Acetic acid | 94.3 g |
| Diethanolamine | 1.17 g |
| Manganese dopant solution | 0.63 g |

Figure 11:
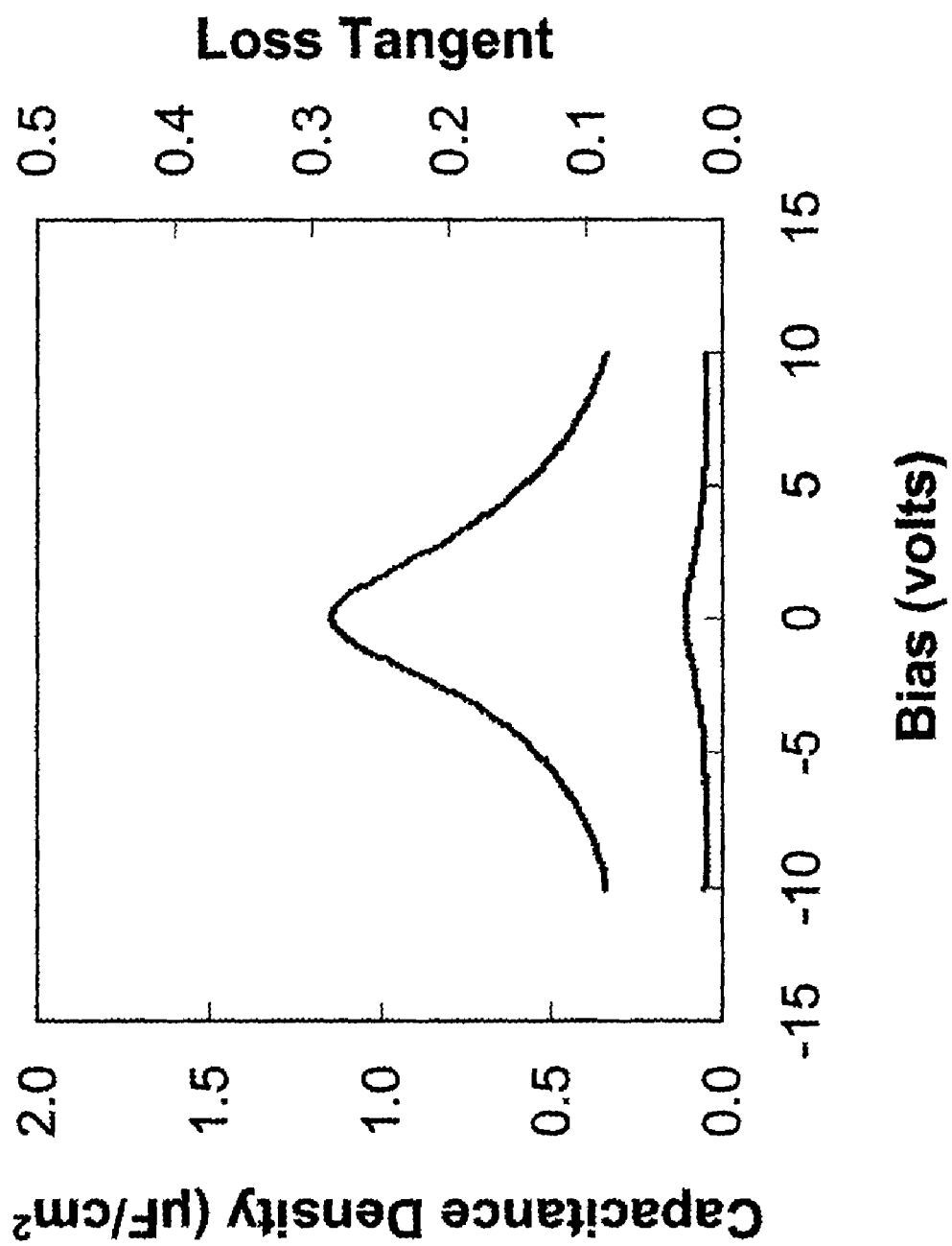
FIG. 11 is a graph showing capacitance density and loss tangent as a function of voltage for 0.01 atom percent manganese doped barium strontium titanate without re-oxidation
Figure 12:
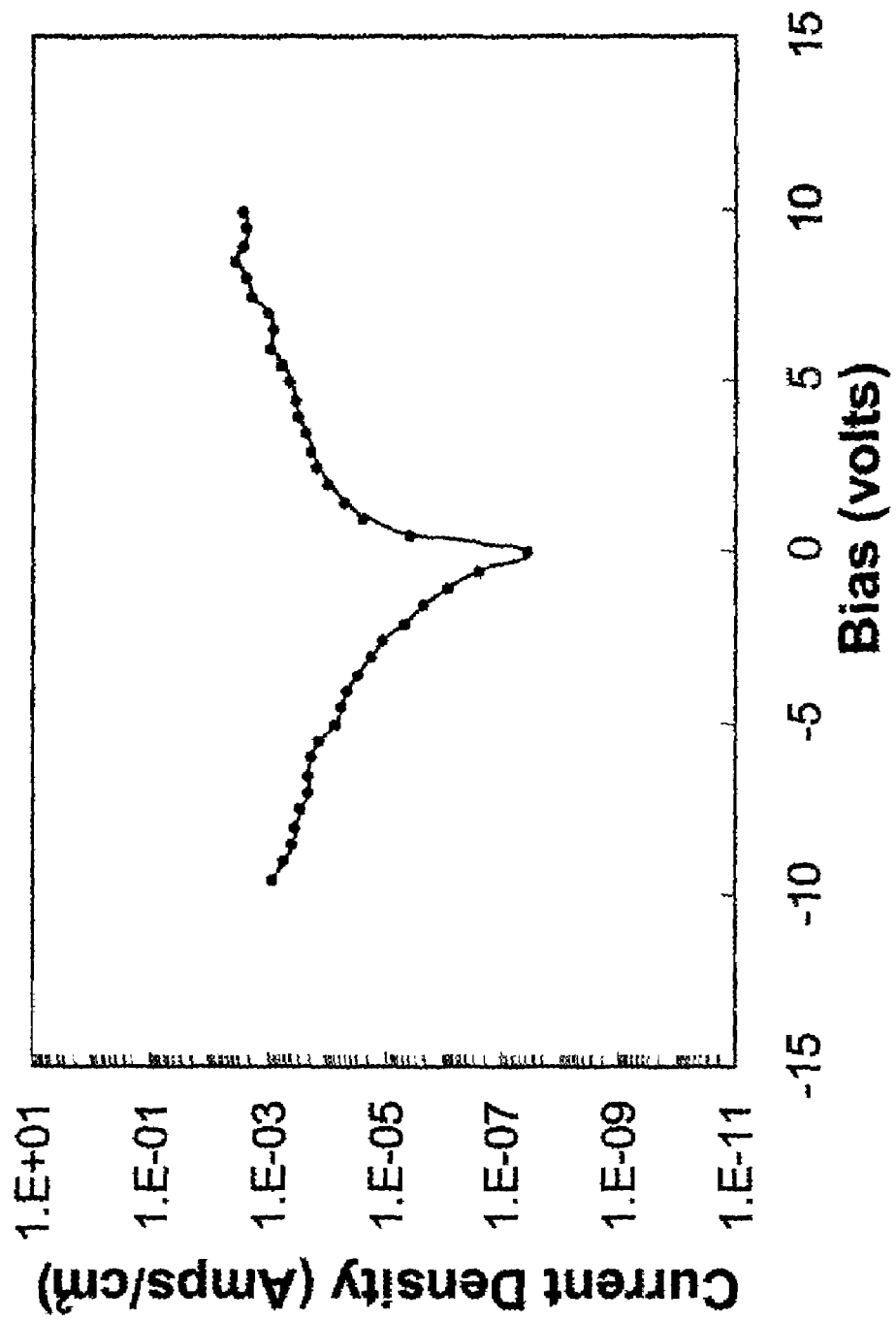
FIG. 12 is a graph showing leakage current density as a function of voltage for 0.01 atom percent manganese doped barium strontium titanate without re-oxidation.

The capacitance density and loss tangent for a manganese doped barium strontium titanate layer without re-oxidation are shown in FIG. 11. The capacitance density was approximately 1.2 μF/cm² at 0 volt and the loss tangent was ≦3% and the dissipation factor did not degrade under bias. As in example 3, the lower capacitance density was as a result of a thicker dielectric. As shown in FIG. 12, the 0.01 atom percent manganese doped barium strontium titanate without an oxidation procedure showed a low leakage current density of approximately 1 milli-amps/cm² at 10 volts bias or approximately 1,000 times lower leakage current flow versus the re-oxidized undoped barium titanate.

What is claimed is:

1. An article comprising
   a dielectric layer
      formed from any solution composition that can form barium titanate during firing and
      containing manganese in an amount between 0.002 and 0.05 atom percent of the solution composition,
   wherein the dielectric layer has been formed on metal foil and fired at a temperature between about 800° C. and 1050° C. in a reducing atmosphere, and wherein the dielectric layer has a thickness between 0.4 and 1.0 micrometer and a grain size between 0.1 and 0.2 micrometers.

2. The article of claim 1, wherein the barium has been partially or substanially replaced by lead, strontium, calcium; or mixtures thereof.

3. The article of claim 1, wherein the titanium has been partially or substansially replaced by zirconium, hafnium, tin; or mixtures thereof.

4. A capacitor comprising the article of claim 1 having a capacitance density of greater than 1 uF/cm².

5. A capacitor comprising the article of claim 1, wherein the dielectric layer has a breakdown voltage greater than 20 volts.

6. A capacitor comprising the dielectric layer of claim 1, having a dissipation factor of less than about 8%.

7. A capacitor comprising the dielectric layer of claim 1, having a leakage current density of less than approximately 1 milli-amp/cm² at 10 volts.

8. An inner layer panel comprising the article of claim 1.

9. A printed wiring board comprising the article of claim 1.

10. The article of claim 1 further comprising a top electrode formed over the dielectric layer.

11. The article of claim 10 wherein the top electrode is formed by sputtering or combustion vapor deposition.

12. The article of claim 10 wherein the top electrode is comprised of copper.

13. The article of claim 1 wherein the metal foil is comprised of a base metal.

14. The article of claim 13 wherein the base metal foil is comprised of copper.

* * * * *